(12) United States Patent
Horning et al.

(10) Patent No.: US 9,534,925 B2
(45) Date of Patent: Jan. 3, 2017

(54) HEMITOROIDAL RESONATOR GYROSCOPE

(71) Applicant: Honeywell International Inc., Morristown, NJ (US)

(72) Inventors: Robert D. Horning, Savage, MN (US); Burgess R. Johnson, Bloomington, MN (US); Robert Compton, Plymouth, MN (US); Eugen Cabuz, Eden Prairie, MN (US)

(73) Assignee: Honeywell International Inc., Morris Plains, NJ (US)

( * ) Notice: Subject to any disclaimer, the term of this patent is extended or adjusted under 35 U.S.C. 154(b) by 410 days.

(21) Appl. No.: 14/090,588

(22) Filed: Nov. 26, 2013

(65) Prior Publication Data

US 2014/0068931 A1 Mar. 13, 2014

Related U.S. Application Data

(62) Division of application No. 13/112,551, filed on May 20, 2011, now Pat. No. 8,631,702.

(Continued)

(51) Int. Cl.
*G01C 25/00* (2006.01)
*G01C 19/5691* (2012.01)
*H03H 9/24* (2006.01)

(52) U.S. Cl.
CPC ........... *G01C 25/00* (2013.01); *G01C 19/5691* (2013.01); *H03H 9/2405* (2013.01); *Y10T 29/49002* (2015.01); *Y10T 29/49117* (2015.01)

(58) Field of Classification Search
CPC ... G01C 19/5691; G01C 25/00; H03H 9/2405; Y10T 29/49117; Y10T 29/49002

(Continued)

(56) References Cited

U.S. PATENT DOCUMENTS 3,680,391 A 8/1972 Denis
4,061,043 A * 12/1977 Stiles ............... G01C 19/16
310/309

(Continued)

FOREIGN PATENT DOCUMENTS

JP 2009092595 4/2009

OTHER PUBLICATIONS

European Patent Office, "European Search Report", "from Foreign Counterpart of U.S. Appl. No. 13/112,551", Jun. 5, 2013, pp. 1-4, Published in: EP.

(Continued)

*Primary Examiner* — Lisa Caputo
*Assistant Examiner* — Philip Cotey
(74) *Attorney, Agent, or Firm* — Fogg & Powers LLC

(57) ABSTRACT

A method for fabricating a vibratory structure gyroscope is provided herein. An annular cavity is formed in a first surface of a substrate, the annular cavity defining an anchor post located in a central portion of the annular cavity. A bubble layer is formed over the first surface of the substrate and over the annular cavity. The substrate and the bubble layer are heated to form a hemitoroidal bubble in the bubble layer over the annular cavity. A sacrificial layer is deposited over the hemitoroidal bubble of the bubble layer and an aperture is formed in the sacrificial layer, the aperture disposed over the anchor post in the annular cavity. A resonator layer is deposited over the sacrificial layer and the sacrificial layer between the bubble layer and the resonator layer is removed.

5 Claims, 9 Drawing Sheets

Related U.S. Application Data

(60) Provisional application No. 61/349,876, filed on May 30, 2010.

(58) Field of Classification Search
USPC ..... 73/504.12, 504.13, 504.18, 504.08, 1.77, 73/503.3
See application file for complete search history.

(56) References Cited

U.S. PATENT DOCUMENTS

| | | | |
|---|---|---|---|
| 4,157,041 A | 6/1979 | Loper, Jr. | |
| 4,793,195 A | 12/1988 | Koning | |
| 4,829,537 A * | 5/1989 | Baer | G01C 19/64 356/459 |
| 5,367,377 A * | 11/1994 | Rahn | H01S 3/083 356/467 |
| 5,495,760 A | 3/1996 | Wirt | |
| 5,656,777 A | 8/1997 | Petri et al. | |
| 5,950,995 A * | 9/1999 | Beckwith | G01C 19/70 267/161 |
| 6,374,672 B1 * | 4/2002 | Abbink | G01C 19/5719 73/504.12 |
| 6,474,161 B1 | 11/2002 | Jeanroy et al. | |
| 6,647,785 B2 | 11/2003 | Stewart et al. | |
| 6,662,656 B2 | 12/2003 | Jeanroy | |
| 6,945,109 B2 | 9/2005 | Renault et al. | |
| 6,955,084 B2 | 10/2005 | Challoner et al. | |
| 7,093,488 B2 | 8/2006 | Ragot et al. | |
| 7,207,221 B2 | 4/2007 | Kawauchi et al. | |
| 7,222,513 B2 | 5/2007 | Caron et al. | |
| 7,318,347 B2 | 1/2008 | Lynch et al. | |
| 7,348,716 B2 | 3/2008 | Ogura et al. | |
| 7,404,325 B2 | 7/2008 | Delevoye | |
| 7,839,059 B2 | 11/2010 | Choi et al. | |
| 8,210,041 B2 | 7/2012 | Ragot | |
| 2002/0133958 A1 * | 9/2002 | Noureldin | E21B 47/022 33/304 |
| 2003/0019296 A1 | 1/2003 | Stewart et al. | |
| 2004/0026720 A1 * | 2/2004 | Schiller | G01C 19/56 257/226 |
| 2005/0274183 A1 | 12/2005 | Shcheglov et al. | |
| 2007/0001662 A1 * | 1/2007 | Suzuki | G01C 19/56 324/117 R |
| 2007/0071922 A1 | 3/2007 | Eklund et al. | |
| 2008/0094309 A1 * | 4/2008 | Pance | H01Q 9/0485 343/911 R |
| 2008/0264167 A1 * | 10/2008 | Kandori | G01C 19/5719 73/504.12 |
| 2009/0049910 A1 | 2/2009 | Caron | |
| 2010/0071439 A1 | 3/2010 | Caron | |
| 2010/0083758 A1 | 4/2010 | Vandebeuque et al. | |
| 2010/0326166 A1 | 12/2010 | Caron et al. | |

OTHER PUBLICATIONS

U.S. Patent and Trademark Office, "Notice of Allowance", "from U.S. Appl. No. 13/112,551", Sep. 23, 2013, pp. 1-8, Published in: US.

U.S. Patent and Trademark Office, "Office Action", "from U.S. Appl. No. 13/112,551", May 28, 2013, pp. 1-10, Published in: US.

U.S. Patent and Trademark Office, "Restriction Requirement", "from U.S. Appl. No. 13/112,551", Apr. 16, 2013, pp. 1-6, Published in: US.

Shkel, "Type I and Type II Micromachined Vibratory Gyroscopes", "Position, Location, and Navigation Symposium 2006", Apr. 2006, pp. 586-593.

Japan Patent Office, "Office Action from JP Application No. 2011-118164 mailed Jan. 20, 2015", "from Foreign Counterpart of U.S. Appl. No. 14/090,588", Jan. 20, 2015, pp. 1-5, Published in: JP.

European Patent Office, "Office Action from EP Application No. 11167500.5 mailed Jul. 8, 2014", "from Foreign Counterpart of U.S. Appl. No. 13/112,551", Jul. 8, 2014, pp. 1-5, Published in: EP.

European Patent Office, "Office Action from EP Application No. 11167500.5 mailed Aug. 18, 2015", "from Foreign Counterpart of U.S. Appl. No. 14/090,588", Aug. 18, 2015, pp. 1-3, Published in: EP.

State Intellectual Property Office, P.R. China, "Office Action from CN Application No. 201110196249.0 mailed Dec. 8, 2014", "from Foreign Counterpart of U.S. Appl. No. 14/090,588", Dec. 8, 2014, pp. 1-12, Published in: CN.

European Patent Office, "Communication under Rule 71(3) EPC from EP Application No. 11167500.5 mailed May 30, 2016", "from Foreign Counterpart of U.S. Appl. No. 13/112,551", May 30, 2016, pp. 1-72, Published in: EP.

* cited by examiner

HEMITOROIDAL RESONATOR GYROSCOPE

CROSS-REFERENCE TO RELATED APPLICATIONS

This application is a divisional of U.S. application Ser. No. 13/112,551, filed on May 20, 2011, which claims the benefit of priority to U.S. Provisional Application No. 61/349,876, filed on May 30, 2010, the disclosure of which is incorporated herein by reference.

BACKGROUND

Vibrating structure gyroscopes detect rotation by sensing changes in the vibration of a vibrating structure such as a resonator. Typically, the resonator is induced to vibrate by some mechanism. Rotation of the vibrating resonator can cause changes in the vibration (e.g., angle, speed). These changes can be detected and used to determine the rotation of the resonator. Vibrating structure gyroscopes typically include piezoelectric, hemispherical, tuning fork, and wheel-type gyroscopes.

Hemispherical type vibrating structure gyroscopes can include a resonator having a hemispherical shell attached to a stem. The stem of the resonator is mounted to a structure, and the resonator can vibrate about the stem. These types of gyroscopes can be made using conventional high-precision machining techniques. It is typically desirable to build this type of gyroscope using micromachining techniques, allowing batch fabrication of many gyroscopes at one time.

In some examples, the uniformity of the hemispherical shell can affect the accuracy with which the vibrations in the hemispherical shell can be used to detect rotation. In addition, the positioning of the stem on the hemispherical shell (e.g., if the stem is off centered) can also affect the accuracy of the gyroscope. Thus, precision in the manufacture of the hemispherical type gyroscope is an important factor that can be difficult to achieve.

SUMMARY

A method for fabricating a vibratory structure gyroscope is provided herein. An annular cavity is formed in a first surface of a substrate, the annular cavity defining an anchor post located in a central portion of the annular cavity. A bubble layer is formed over the first surface of the substrate and over the annular cavity. The substrate and the bubble layer are heated to form a hemitoroidal bubble in the bubble layer over the annular cavity. A sacrificial layer is deposited over the hemitoroidal bubble of the bubble layer and an aperture is formed in the sacrificial layer, the aperture disposed over the anchor post in the annular cavity. A resonator layer is deposited over the sacrificial layer and the sacrificial layer between the bubble layer and the resonator layer is removed.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1A:
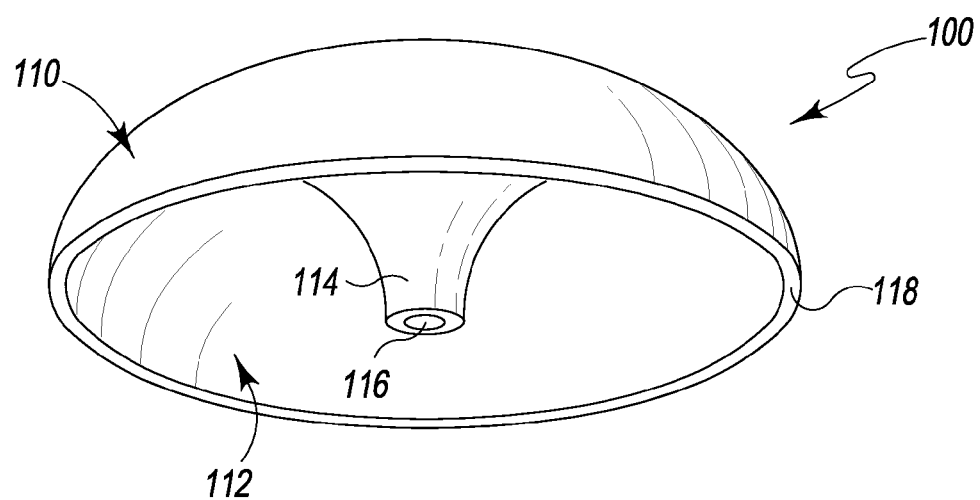
FIG. 1A is a perspective view of a hemitoroidal resonator for a vibrating structure gyroscope according to one embodiment.

In the following detailed description, reference is made to the accompanying drawings that form a part hereof, and in which is shown by way of illustration specific illustrative embodiments. It is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Figure 1B:
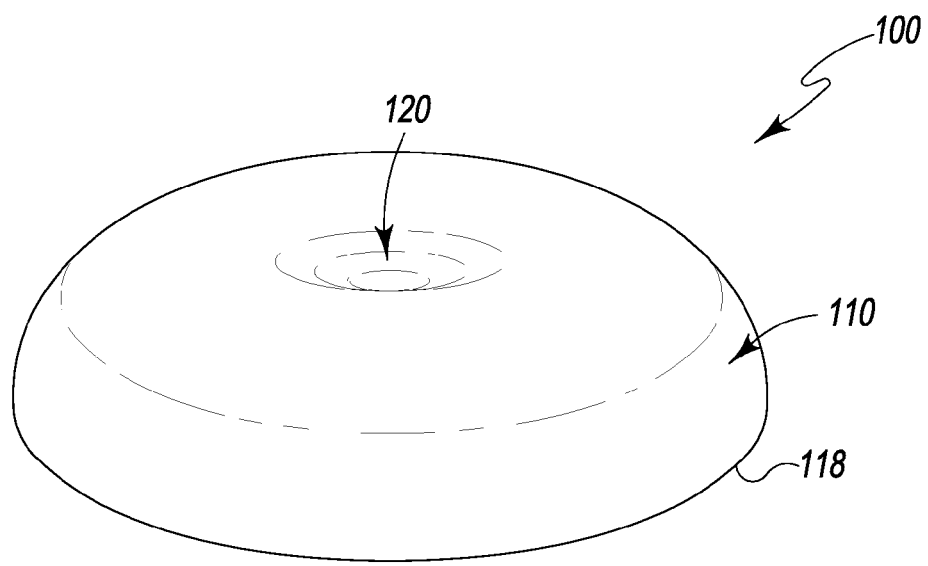
FIG. 1B is another perspective view of the hemitoroidal resonator of FIG. 1A.
Figure 1C:
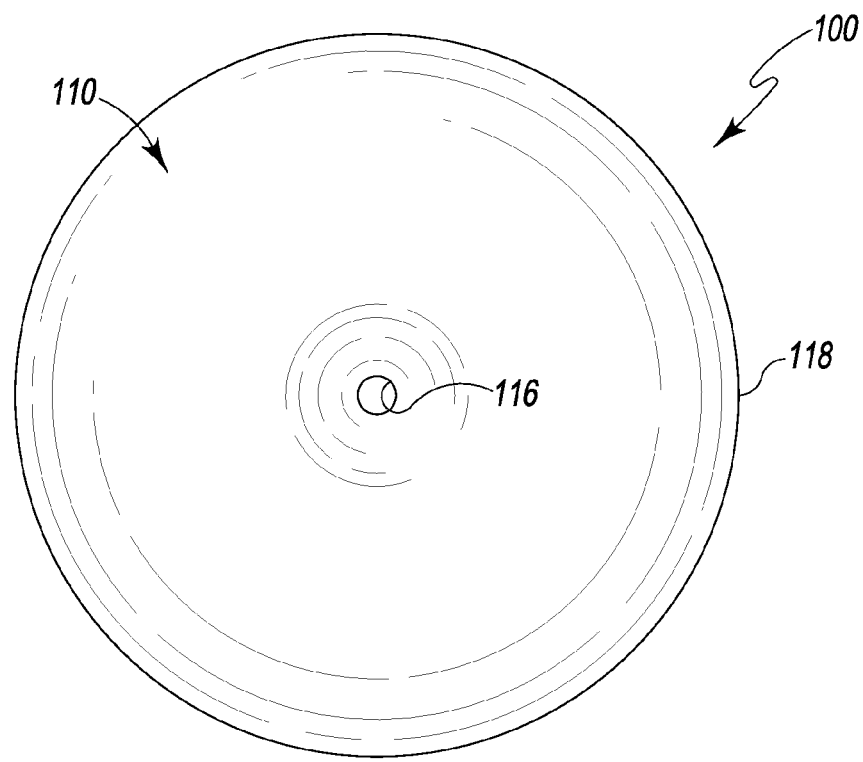
FIG. 1C is a top view of the hemitoroidal resonator of FIG. 1A.

FIGS. 1A, 1B, and 1C illustrate a resonator 100 having a hemitoroidal shape for use in a vibrating structure gyroscope according to one embodiment. The resonator 100 has an outer surface 110 and a corresponding inner surface 112 that follows the contours of the outer surface 110. The resonator 100 can protrude inwardly at a central portion thereof to form a central stem 114 with an aperture 116. The stem 114 can provide a point of attachment for the resonator 100 to an underlying structure. An outer lip 118 of the resonator 100 surrounds the stem 114. As shown in FIG. 1B, the hemitoroidal shape of resonator 100 results in an inward depression 120 in the central portion of the outer surface 110. This inward depression 120 forms the stem 114 as illustrated in FIG. 1A.

In one example, the resonator 100 can be composed of a glass material such as silica (e.g., amorphous $SiO_2$). In other examples, the hemitoroidal resonator 100 can be composed of another glass material having a low coefficient of thermal expansion (CTE). A low CTE can help reduce thermoelastic damping of the resonator 100. Thermoelastic damping can define the fundamental limit to the quality factor Q of the resonator 100. Thermoelastic damping can occur when compressive and tensile stresses produce heating and cooling within the material of the resonator 100. This can induce a temperature gradient across the thickness of the resonator 100. The resulting heat flow can dissipate the mechanical energy of the resonator 100. The rate of thermoelastic damping can be proportional to the square of the CTE; therefore, in some examples it can be advantageous to construct the resonator 100 of a material with a low CTE. In some examples, a few percent of titania (amorphous $TiO_2$) can be included in the silica material forming resonator 100 to reduce the CTE. A CTE near zero can be achieved when the titania concentration is about 7%. In other examples, the resonator 100 can be composed of another material that provides high mechanical quality factor, such as silicon, diamond, etc.

The hemitoroidal shape enables the resonator 100 to have excellent vibratory characteristics while also enabling the resonator 100 to be precisely fabricated in a micro-electro-mechanical systems (MEMS) scale chip. Notably, the hemitoroidal shape can be fabricated with a high degree of symmetry about its central axis of symmetry.

In one embodiment, the stem 114 of the resonator 100 is integrally formed in the central portion of the hemitoroid. This enables the stem 114 to be aligned with respect to the outer lip 118 with high precision, since the stem 114 and resonator 100 are formed in the same step(s). This also enables the resonator 100 to have increased strength since the stem 114 is an integral part of the resonator 100. Notably, the increased precision and strength of the resonator 100 are due in part to the fact that the stem 114 and the resonator 100 are not fabricated in separated steps and then connected together. Additional detail regarding the fabrication process is provided with respect to FIGS. 4A-4M described hereafter.

In one exemplary embodiment, the stem 114 can have an outer diameter of about 10-400 microns, while the outer lip 118 can have a diameter of about 0.5-4 mm (e.g., about 2 mm). The resonator 100 can have a material thickness of about 3-30 microns.

Although the hemitoroidal resonator 100 in FIGS. 1A, 1B, and 1C is shown having a specific height, diameter, radius of curvature, stem width, and aperture size, it should be understood that other sizes of these parts of the hemitoroidal resonator 100 can be used. Moreover, in some examples the stem 114 may be solid and thus may not include an aperture 116.

Figure 2:
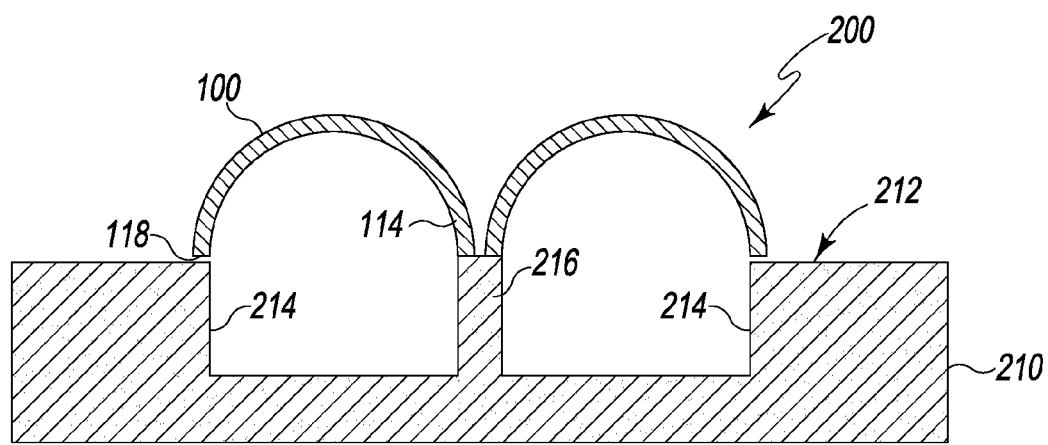
FIG. 2 is a cross-sectional side view of a hemitoroidal resonator gyroscope according to one embodiment.

FIG. 2 is a cross-sectional side view of a hemitoroidal resonator gyroscope 200 having resonator 100 therein. In this example, the gyroscope 200 is a MEMS scale gyroscope. Accordingly, the gyroscope 200 can be fabricated on a single wafer using semiconductor fabrication processes. The gyroscope 200 can include a substrate 210 having a top working surface 212. The stem 114 of the resonator 100 can be attached to the top working surface 212 of the substrate 210. The outer lip 118 of the resonator 100 is separated from the surface 212 such that the resonator 100 can vibrate freely about the stem 114.

The substrate 210 can define an annular cavity 214 in the top working surface 212. An anchor post 216 of the substrate 210 can extend through a central portion of the annular cavity 214. In an example, additional semiconductor conductor components can be fabricated on the top working surface 212 of the substrate 210. The stem 114 of the resonator 100 can be attached to the anchor post 216. The substrate 210 can include a silicon wafer, a gallium arsenide wafer, silica, silicon carbide, a glass-ceramic (e.g., Zerodur® a zero expansion glass-ceramic manufactured by Schott AG), or other materials.

Figure 3A:
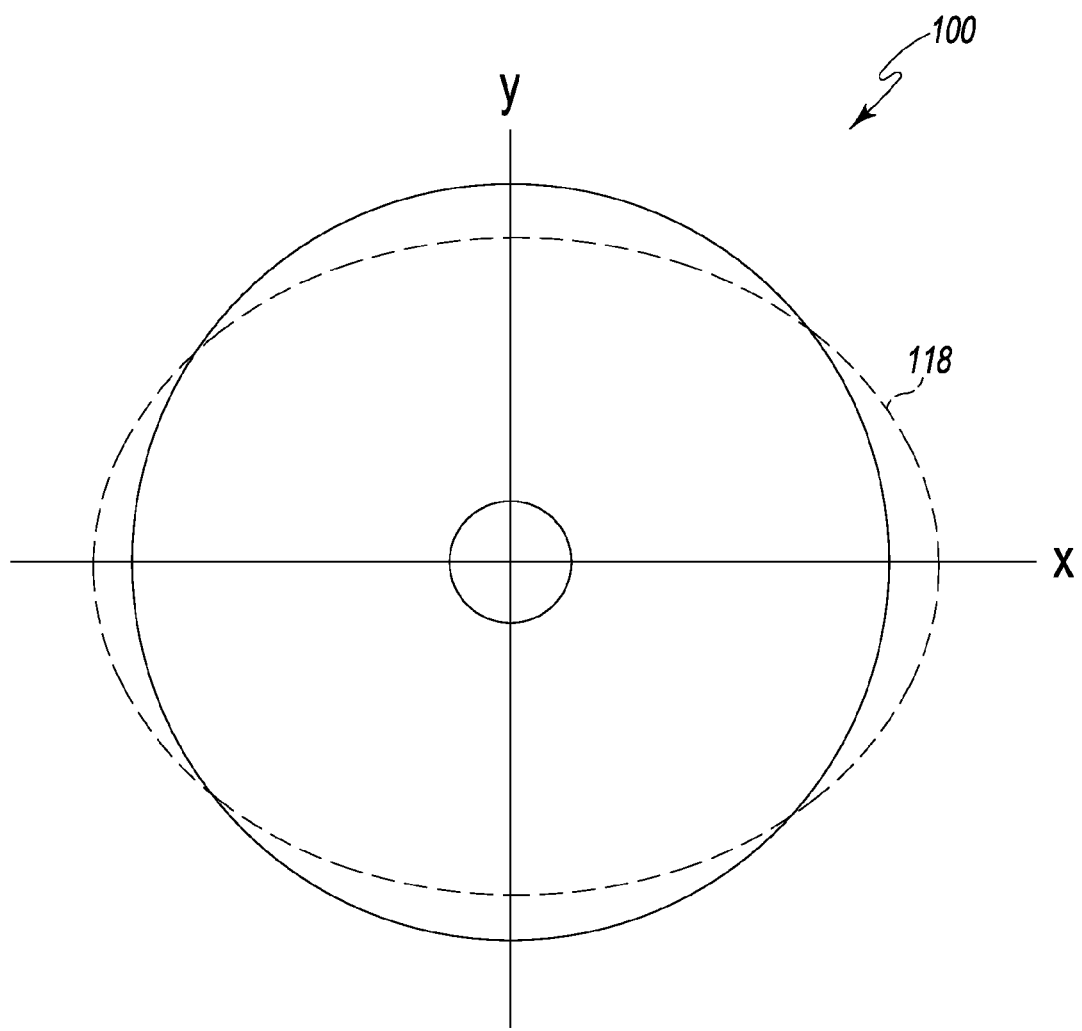
FIG. 3A is an illustration of a vibratory mode for a hemitoroidal resonator according to one embodiment.
Figure 3B:
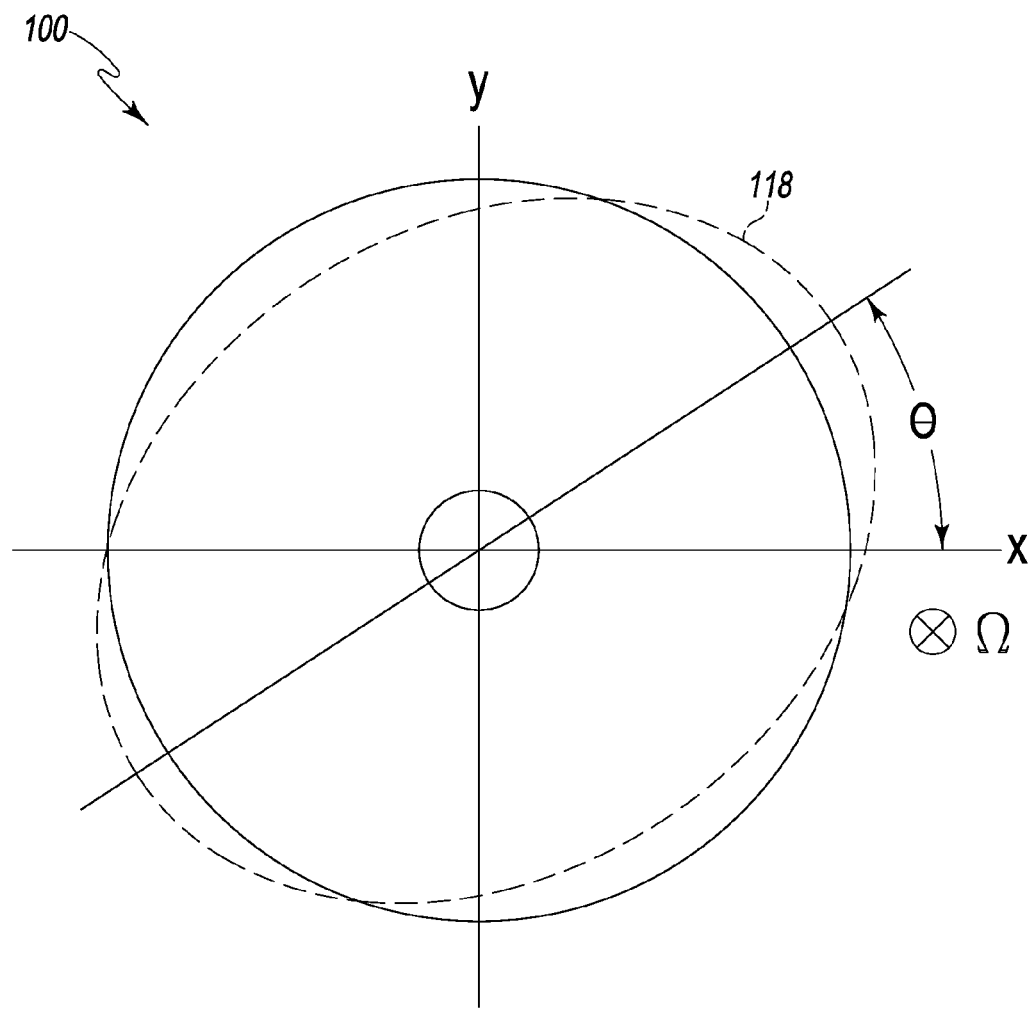
FIG. 3B is an illustration of precession of a vibratory mode for a hemitoroidal resonator according to one embodiment.

FIGS. 3A and 3B illustrate a top profile view of a vibratory mode for the hemitoroidal resonator 100. As shown, the resonator 100 can be resonant in an n=2 quadrupole mode. In FIG. 3A, the outer lip 118 of the hemitoroidal resonator 100 is shown with instantaneous displacement outward along the x-axis, and inward along the y-axis. One-half vibration cycle later in time, the displacement would be outward along the y-axis and inward along the x-axis. In FIG. 3B, precession of the orientation of n=2 quadrupole vibratory mode is shown. The mode is shown rotated by angle theta due to external applied rotation Ω. The rotation vector is along the z-axis (out of plane of the paper). The angle theta increases with time, that is, the mode precesses about the z-axis.

FIGS. 4A-4M illustrate various stages in an example fabrication process for the hemitoroidal resonator gyroscope 200. The fabrication process can begin with a substrate 210 (e.g., a silicon wafer).

Figure 4A:
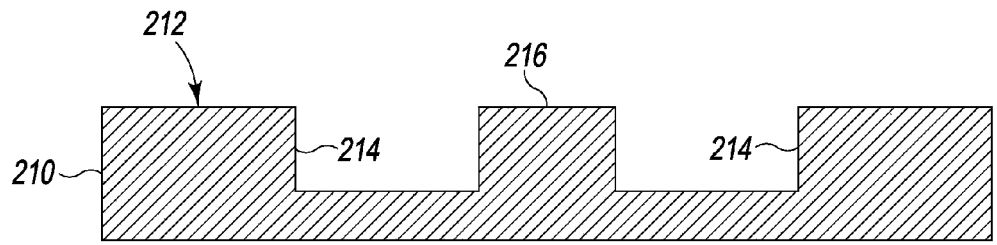
FIGS. 4A-4M are cross-sectional side views of various stages in a fabrication process for a hemitoroidal resonator gyroscope according to one embodiment.

FIG. 4A depicts the substrate 210 after patterning and etching (e.g., using a photomask) of the top working surface 212 to form an annular cavity 214 and an anchor post 216. In one example, etching to form the annular cavity 214 can include deep reactive ion etching (DRIE). The anchor post 216 can be formed during the same patterning and etching step (e.g., using the same photomask) as used to form the annular cavity 214. Therefore, the outer dimension of the annular cavity 214 can be formed using the same patterning and etching step as the anchor post 216. This enables the positioning accuracy (e.g., the alignment with respect to the outer dimension) of the anchor post 216 to be as good as the positioning accuracy of the mask-writing process. That is, the positioning accuracy is not dependent upon the alignment accuracy of a patterning step (e.g., one patterning step trying to align a feature with a feature produced in another patterning step).

In one example, mask writing can be done with a spot size/tolerance smaller than 0.05 microns. In a conventional hemispherical resonator, similar alignment would likely be done by photolithographic alignment, wafer bonding, or some other process having an alignment tolerance on the order to 1 to 2 microns, a factor of 20-40 times worse than for the present hemitoroidal resonator. In one embodiment, the anchor post 216 can be about 200 microns in diameter.

In an example, the depth of the annular cavity 214 can be determined in order to achieve a desired hemitoroidal bubble as explained below. Assuming ideal gas behavior, the depth of the annular cavity 214 can be calculated as $$D = \frac{\pi r}{4}\left(\frac{P_A T_B}{P_B T_A - P_A T_B}\right),$$

where r is the radius of the toroidal tube, $P_B$ and $T_B$ are the gas pressure and temperature, respectively, at which the glass wafer 310 (See FIG. 4B) is bonded to the substrate 210, and $P_A$ and $T_A$ are the gas pressure and temperature, respectively, at which the wafer is annealed in FIG. 4C below.

In some examples, patterning and etching can also form other features on the substrate 210. Additionally, in some examples, the substrate 210 can be moderately conductive. Accordingly, a heavily doped silicon wafer can be used or dopant can be diffused into the surface 212 (not shown) after etching the annular cavity 214.

Figure 4B:
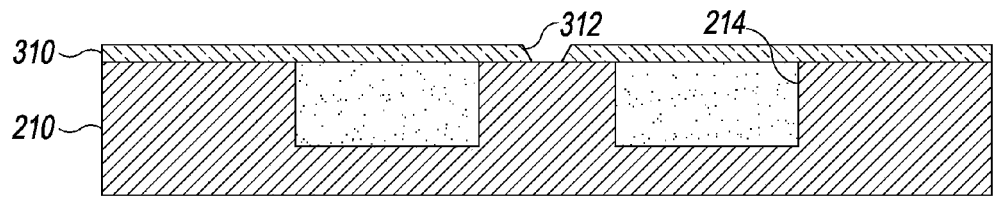

FIG. 4B illustrates a bubble layer 310 on the substrate 210. In an example, the bubble layer 310 can initially comprise a glass wafer. The glass wafer can be anodically bonded to the patterned and etched surface 212 of the substrate 210. The glass wafer can be composed of materials such as Corning Pyrex, Corning Eagle XG, Schott Borofloat, or Hoya SD2. The glass wafer can be thinned by lapping and polishing to a desired thickness (e.g., about 10-100 microns). In an example, the glass wafer can be thinned after bonding to substrate 210; however, in another example, the glass wafer can be thinned before bonding to the substrate 210. In another example, the glass wafer can be thinned by etching. After the glass wafer has been bonded to the substrate 210, the glass wafer can be etched to form an aperture 312 over the anchor post 216. In an example, the aperture 312 can have a tapered edge that is smaller closer to the anchor post 216.

The subsequent steps of the process described hereafter show a bubble expanded outward in the glass wafer. In order to expand the glass wafer, gas of a certain pressure can be present in the annular cavity 214. In an example, the pressure of gas used is a function of the properties of the glass wafer, the temperature in the annular cavity 214 before and after the gas is expanded, etc. In order to achieve the desired pressure and composition in the annular cavity 214, the chamber housing the substrate 210 during anodic bonding can be filled with the desired pressure and composition of gas. A variety of gases can be used, for example, nitrogen, argon, air, etc. could be used, at a typical pressure of 0.2 to 1 atmosphere. In any case, a density of gas should be present such that when expanded "blows" a bubble in the glass wafer such that the bubble reaches a desired size and ceases to expand.

Figure 4C:
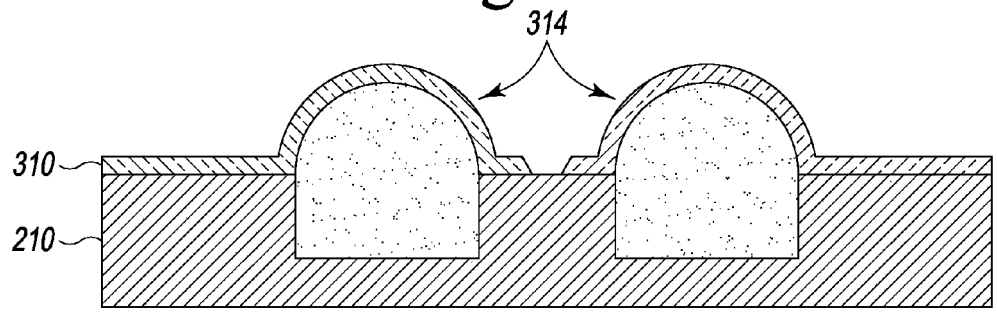

FIG. 4C illustrates a hemitoroidal bubble 314 formed in the bubble layer 310. In an example, the hemitoroidal bubble 314 is substantially symmetric around the anchor post 216. The bubble 314 can be formed by heating the substrate 210 and bubble layer 310 beyond the softening point of the bubble layer 310. For example, the substrate 210 and the bubble layer 310 can be heated to about 850 degrees Celsius for Pyrex glass, about 975 degrees Celsius for Eagle XG or SD2 glass, or about 1700 degrees Celsius for fused silica.

As the temperature rises, the pressure in the cavity will exceed the external pressure, causing the gas in the annular cavity 214 to expand and form the bubble 314 in the softened glass over the annular cavity 214. Surface tension can help to form the bubble 314 with a substantially constant radius of curvature such that the bubble 314 is symmetrical about the anchor post 216. The temperature can be controlled to control expansion of the gas and the resulting size of the bubble 314. Once the bubble 314 has reached the desired size, the bubble 314 can be allowed to harden by reducing the temperature at a rate sufficiently fast that the bubble does not collapse before hardening. The cooling rate can depend on the glass thickness, volume of the annular cavity, size of the bubble 314, etc. Once hardened the hemitoroidal bubble 314 can become the template for the remainder of the resonator 100.

Since the hemitoroidal shape of the bubble 314 forms naturally as a result of heating the gas within the annular cavity 214, the bubble 314 can be formed with high precision. Since the bubble 314 is a template for the hemitoroidal resonator 100, forming the bubble 314 with high precision also results in a high precision resonator 100. In addition, since both the stem 114 and the outer lip 118 of the resonator 100 are formed using the bubble 314, the alignment of the stem 114 with respect to the outer lip 118 is based on the precision of the bubble 314. As mentioned above, the precision of the bubble 314 is a natural result of the annular cavity 214 and the anchor post 216. Thus, the precision of the resonator 100 including the alignment of the stem 114 with respect to the outer lip 118 is based on the precision with which the annular cavity 214 and the anchor post 216 can be formed. Since, as mentioned above, the annular cavity 214 and the anchor post 216 are formed using the same patterning and etching steps, the precision of the annular cavity 214 and the anchor post 216 can be quite high (e.g., having a tolerance smaller than 0.05 microns). Accordingly, the resonator 100 can be formed with high precision.

Figure 4D:
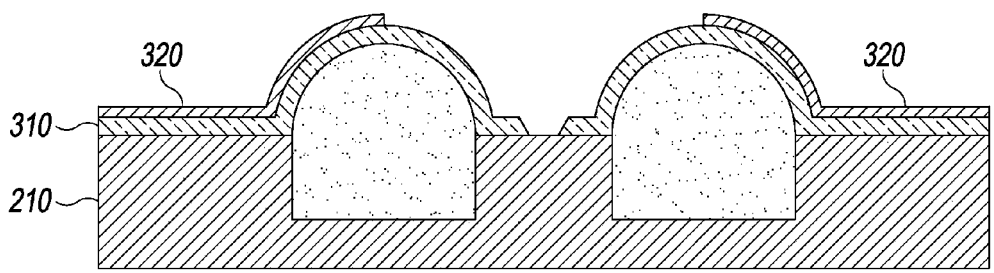

FIG. 4D shows a first conductive layer 320 deposited on the bubble layer 310. The first conductive layer 320 can then be patterned to form a plurality of electrodes. In an example, the plurality of electrodes can extend from an outside edge of the bubble layer 310 towards a top portion of the bubble 314. The plurality of electrodes can form a plurality of extended portions of the conductive layer 320. The plurality of electrodes can be used to drive and balance the resonator 100. In an example, the first conductive layer 320 can be composed of polycrystalline silicon ("polysilicon") and the plurality of electrodes can be formed by ion implantation all the way through the polysilicon followed by a rapid anneal.

In other examples, the first conductive layer 320 can be composed of other materials including gold, nichrome, chromium, indium tin oxide (ITO), doped titania silicate glass, and the like. Although FIG. 4D illustrates the plurality of electrodes primarily on the outside of the hemitoroidal bubble 314, in other examples, the plurality of electrodes can be patterned on other locations of the bubble 314 as well as on structures (not shown) other than the bubble 314.

Figure 4E:
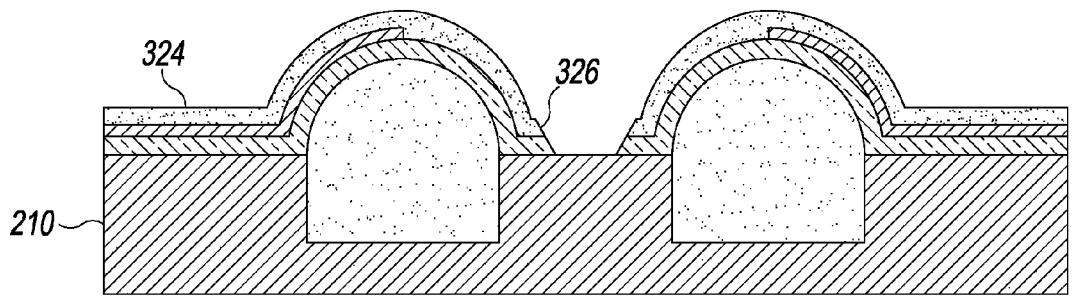

FIG. 4E illustrates a sacrificial layer 324 deposited on the first conductive layer 320. The sacrificial layer 324 can be patterned and etched to form an aperture 326. Similar to the bubble layer 310, an aperture 326 in the sacrificial layer 324 can be formed over the anchor post 216. In an example, the aperture 326 can have a tapered edge that is smaller closer to the anchor post 216.

The patterning and etching of the sacrificial layer 324 can also be used to form contacts (not shown) and other features (e.g., in the field 324). In some examples, patterning can be performed with a projection type of lithography such as e-beam lithography or a stepper.

In an example, the sacrificial layer 324 can be composed of polysilicon (e.g., when the first conductive layer 320 is composed of a material other than polysilicon). In other examples, the sacrificial layer 324 can be composed of a rapidly etching glass or one of several selectively etching metals such as titanium (Ti), molybdenum (Mo), Chromium (Cr), and the like. In yet other examples, the sacrificial layer 324 can be composed of silicon nitride ($Si_3N_4$), molybdenum alloys (Moly), aerogel, polyimide, or parylene. In still other examples, the sacrificial layer 324 can be composed of multiple layers of material. For example, if the first conductive layer 320 is composed of polysilicon, a first layer of the sacrificial layer 324 can be composed of metal (Ti, Mo, Cr, etc.) with a thicker layer of polysilicon on top.

In an example, a low pressure chemical vapor deposition (LPCVD) is used to form the sacrificial layer 324. In another example, a plasma enhanced chemical vapor deposition (PECVD) process can be used to form sacrificial layer 324. In addition, multiple depositions can be employed to produce a thicker sacrificial layer 324. The deposition conditions can be varied to give balanced stress in the sacrificial layer 324. In an example, the sacrificial layer 324 can have a thickness of about 5-20 microns.

Figure 4F:
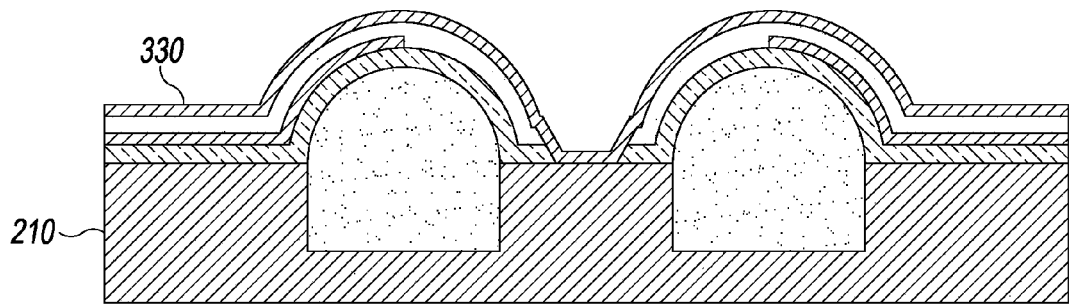

FIG. 4F shows a second conductive layer 330 deposited on the sacrificial layer 324. The second conductive layer 330 can then be patterned to form one or more electrodes for the inner surface 112 of the resonator 100. In an example, the one or more electrodes can be thin (e.g., less than 200 angstroms) with respect to the resonator layer 334 in order to reduce the impact of the electrode materials on the thermoelastic damping of the resonator.

In an example, the second conductive layer 330 can be composed of polysilicon. In other examples, the second conductive layer 330 can be composed of other materials including gold, nichrome, chromium, indium tin oxide (ITO), doped titania silicate glass, and the like.

Figure 4G:
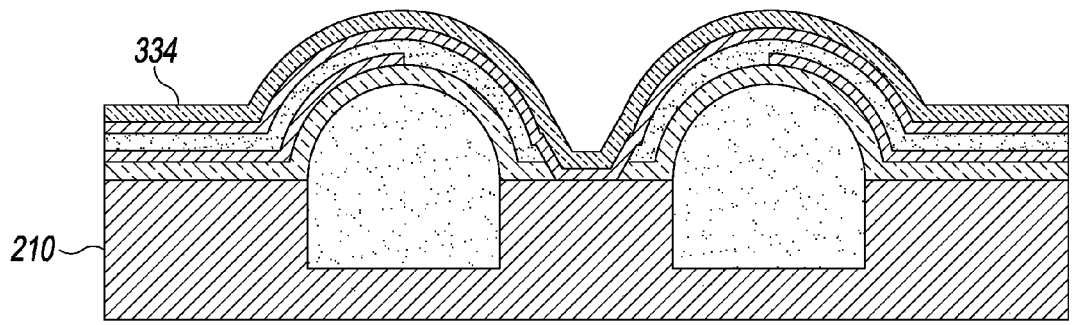

FIG. 4G illustrates a resonator layer 334 deposited over the second conductive layer 330. In one example, the resonator layer 334 can be composed of a glass material such as silica (e.g., amorphous SiO2). In other examples, the resonator layer 334 can be composed of another glass material having a low coefficient of thermal expansion (CTE). A low CTE can help reduce thermoelastic damping of the resulting resonator. In some examples, a few percent of titania (amorphous $TiO_2$) can be included in the silica material of the resonator layer 334 to reduce the CTE. A CTE near zero can be achieved when the titania concentration is about 7%. In other examples, the resonator layer 334 can be composed of another material that provides high mechanical quality factor, such as silicon, diamond, etc.

In one example, the resonator layer 334 can have a thickness of about 10 microns. In some examples, the resonator layer 334 can have a variable thickness such that the resulting resonator is thinner at the outer lip 118 and thicker elsewhere for robustness. In an example, standard deposition techniques can be utilized in forming the resonator layer 334, such as chemical vapor deposition (CVD), low pressure CVD (LPCVD), atmospheric pressure CVD (APCVD), thermal oxidation, sputtering, tetraethyl orthosilicate (TEOS) plus anneal, PECVD plus anneal, and low temperature oxide (LTO).

In one example, an oxide sputter deposition rate can be about 70 angstroms per minute, while the sputter target surface can get depleted of one component such as silicon. Also, the substrate 210 can be heated to an appropriate temperature (e.g., 400° C.) such that the resonator layer 334 forms an amorphous glass coating. In an example, the resonator can be designed to transmit little stress to the anchor post 216 at an aperture through the anchor post 216. For example, the radius (e.g., width) of the stem 114 of the hemitoroidal resonator can be formed to be greater than the radius of the aperture in the anchor post 216.

Figure 4H:
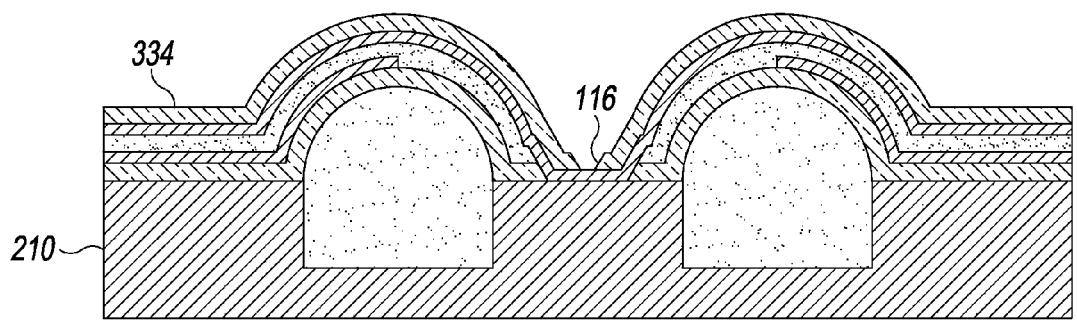
Figure 4I:
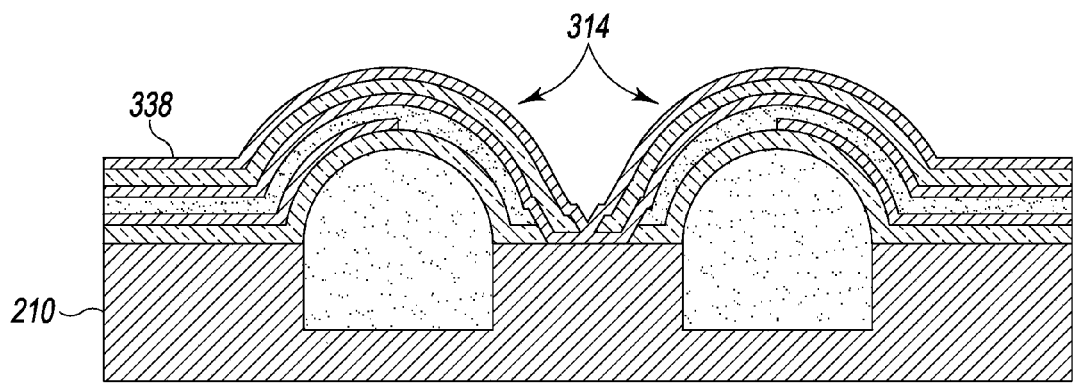

FIG. 4H depicts the resonator layer 334 patterned and etched to produce the aperture 116 in the stem 114. In an example, the aperture 116 in the stem 114 can be used for coupling of a third conductive layer 338 to the second conductive layer 330 as shown in FIG. 4I. The aperture 116 can be formed with tapered edges wherein the diameter of the aperture 116 is smaller closer to the anchor post 216.

FIG. 4I shows the third conductive layer 338 deposited on the resonator layer 334. The third conductive layer 338 can then be patterned to form one or more electrodes for the outer surface 110 of the resonator 100. In an example, a continuous electrode is formed for the outer surface 110 of the resonator 100. Thus, for a continuous electrode, patterning may be used only in the field 342 adjacent to the hemitoroidal bubble 314 to form contacts, leads, etc. In an example, the one or more electrodes can be thin (e.g., less than 200 angstroms) relative to the resonator layer 334 in order to reduce the impact of the electrode materials on the thermoelastic damping of the resonator 100.

The third conductive layer 338 can be composed of polysilicon and the one or more electrodes can be formed by ion implantation followed by a rapid anneal. In other examples, the third conductive layer 338 can be composed of other materials including gold, nichrome, chromium, ITO, doped titania silicate glass, and the like. In an example, the third conductive layer can comprise a tungsten film this deposited by CVD to produce a uniform metal film for a conductor on the resonator 430. The CVD-deposited tungsten can also form a barrier layer for etchant of the sacrificial layer (as described with respect to FIG. 4K.

In an example, one or more pad layers (not shown) can also be formed for wire bonding. Standard materials and techniques can be used to form the pad layers.

Figure 4J:
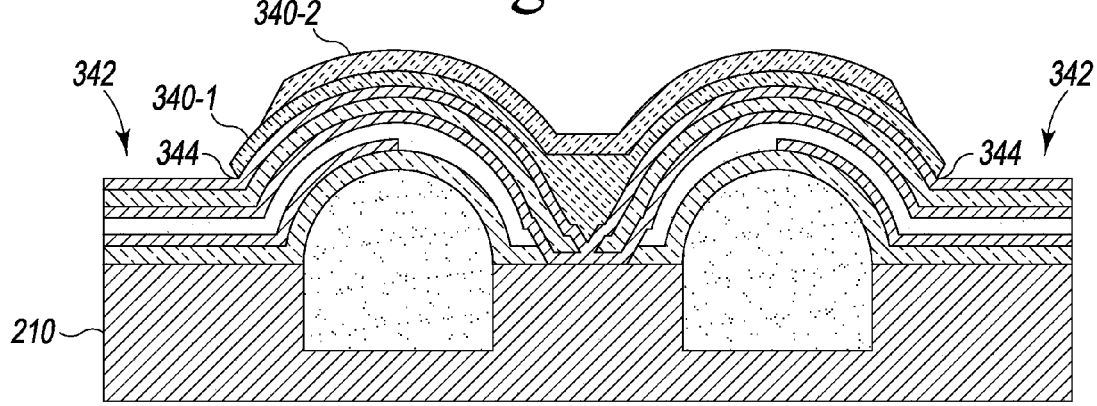

FIG. 4J illustrates a photoresist layer 340 over the resonator layer 334. The photoresist layer 340 can be patterned in order to remove the photoresist layer 340 except over the hemitoroidal bubble 314. That is, after patterning and etching, the remaining portion of the photoresist layer 340 can cover the portion of the resonator layer 334 that will result in the resonator 100.

In an example, a multi-step photoresist can be used. For example, a first layer 340-1 of photoresist that is thin and relatively uniform thickness over the entire surface of the bubble 314 can be deposited by, for example, spraying a mist of small droplets of photoresist. This first photoresist layer 340-1 can be exposed and developed to remove the resist in the areas approximately parallel to the surface 212 of the substrate 210. That is, exposing and developing the first photoresist layer 340-1 can remove the photoresist 340-1 in areas such as the tops of the hemitoroidal bubble 314 and a flat field 342 adjacent the hemitoroidal bubble 314. The exposure, however, can be limited such that the photoresist 340-1 on the slope of the hemitoroidal bubble 314 can remain with a sufficient thickness. In an example, the exposure can be controlled such that the photoresist 340-1 covers the bottom edge (e.g., where the outer lip 118 will be formed) and ends cleanly at the boundary between the bubble 314 and the flat field 342.

This process can be used to define the outer lip 118 of the resonator 100. This process can enable tight control of the definition of the outer lip 118 since the photoresist edge is automatically aligned with the future outer lip 118 of the resonator 100 by using the curvature of the bubble 314 to remove portions of the photoresist on the field 342, but leave portions of the photoresist on the bubble 314 wherever the surface of the bubble 314 is approximately perpendicular to the surface 212.

Once the first photoresist layer 340-1 is exposed, a second photoresist layer 340-2 can be printed over the first photoresist layer 340-1. In an example, this second photoresist layer 340-2 can be relatively crude in alignment as long as the photoresist 340-2 covers most of the bubble 314 without covering an edge 344 of the first photoresist layer 340-1. That is, the outer lip 118 of the resulting resonator 100 can be defined primarily by the first photoresist layer 340-1 instead of the second photoresist layer 340-2.

Figure 4K:
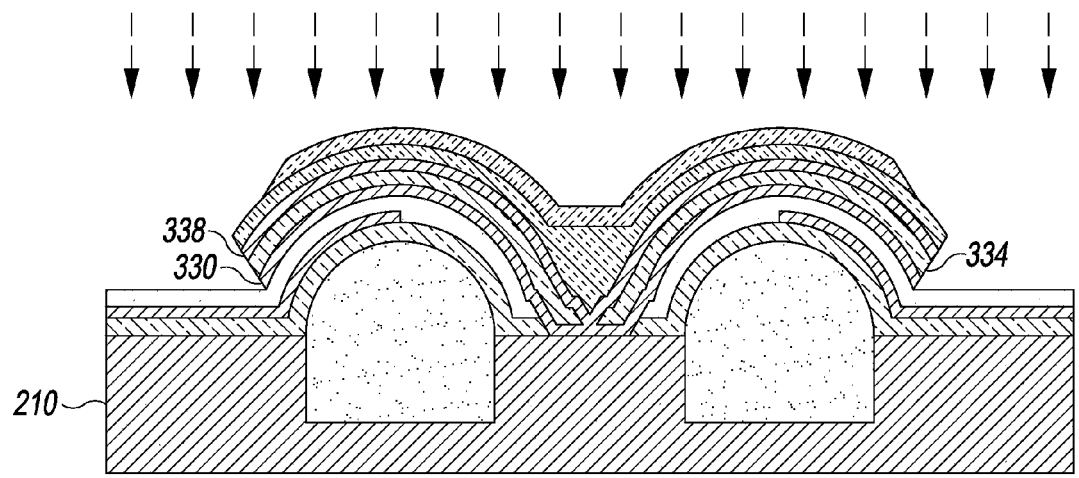

In FIG. 4K, the third conductive layer 338, the resonator layer 334, and the second conductive layer 330 can be etched using directional etches. In an example, ion milling can be used to etch. In another example, reactive ion etching can be used. The directional etching in combination with the defined edge 344 of the photoresist layer 340 can produce a cut into the third conductive layer 338, the resonator layer 334, and the second conductive layer 330 that is aligned with the outer lip 118 of the resulting resonator 100.

Figure 4L:
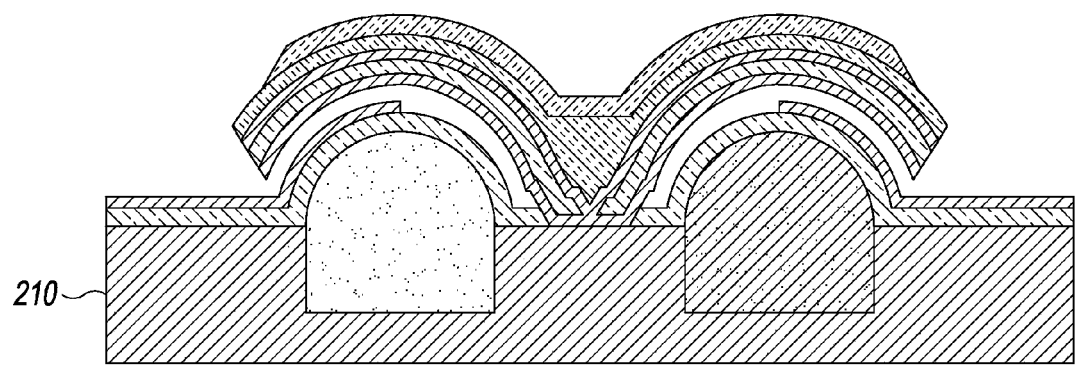

In FIG. 4L, the sacrificial layer 324 can be exposed and etched away. For example, if the sacrificial layer 324 is polysilicon, a liquid etchant such as ethylenediamine pyrocatechol (EDP) or a gaseous etchant such as $XeF_2$ can be used. In some examples, the gaseous etchant is desirable since it can reduce "stiction" problems that arise from the use of liquids around compliant structures. There are, however, other techniques for reducing stiction (e.g., self-assembled monolayers, freeze drying, etc.) that can be used when using a liquid etchant.

In an example, if the sacrificial layer 324 comprises multiple different layers, the thicker polysilicon can be etched first, with the metal protecting the underlying polysilicon electrode from the etchant. Then the metal can be removed, exposing the electrodes of the first conductive layer 320. Suitable sacrificial etchants can include hot phosphoric acid for $Si_3N_4$, $H_2O_2$ for Molybdenum, $XeF_2$ for polysilicon, oxygen plasma for polyimide, and buffered oxide etch (BOE) for aerogel. In an example, the etchant selections can allow etching of the sacrificial layer several microns thick on about a 1 millimeter radius hemitoroid without attacking the device layers.

Figure 4M:
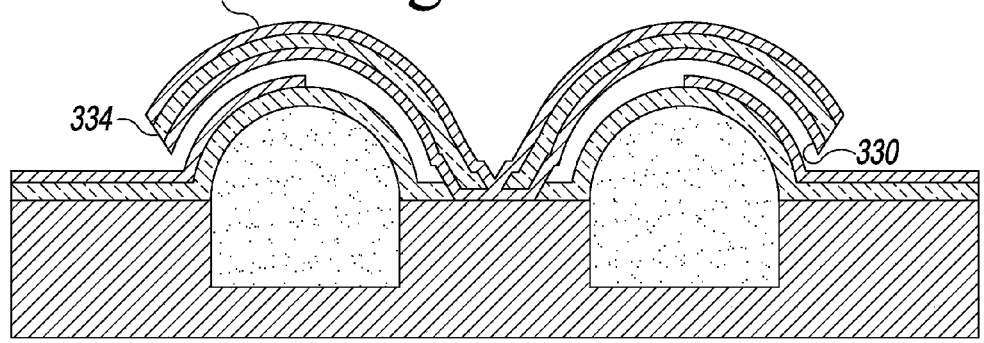

At FIG. 4M, the photoresist layer 340 is removed. In an example, liquid solvents can be used to remove the photoresist layer 340. In another example, dry techniques (e.g., $O_2$ plasma ashing) can be used to remove the photoresist layer 340.

Although an example fabrication process is described above, it should be understood that other alternative processes can be utilized in fabricating a hemitoroidal resonator gyroscope. For example, instead of attaching the hemitoroidal resonator 100 to the anchor post 216 directly, in another example, the resonator 100 can be attached to the bubble layer 310 above the anchor post 216. That is, the bubble layer 310 may not have the aperture 312 etched therein. Without the aperture 312 in the bubble layer 310, the resonator 100 can attach to the bubble layer 310 instead of the anchor post 216.

In another example, a hemitoroidal resonator can be formed with an inward bubble extending into a cavity in a substrate. For example, a cavity having a hemitoroidal shape can be formed in a substrate. The cavity can form a hemitoroidal template for the resonator. An isotropic silicon etchant can be used to produce the sloped sidewalls for the hemitoroidal cavity. Once the hemitoroidal cavity is formed, a resonator layer can be bonded to the substrate in a vacuum such that a vacuum is formed in the hemitoroidal cavity. The substrate and bubble layer can then be heated in a pressurized chamber such that a bubble is formed in the resonator layer that extends into the annular cavity. Forcing the bubble into the annular cavity can form a more robust anchor post for the hemitoroidal resonator. Electrodes can then be formed on the sidewall of the annular cavity. Other steps in the fabrication process can be similar to that described with respect to FIGS. 4A-4M.

In yet another example, a resonator layer can be placed on the substrate and a bubble can be formed in the resonator layer directly. For example, a low CTE glass, such as Corning ULE® glass, for use as a resonator can be directly bonded to a substrate. Inward or outward bubbles could then be formed directly in the low CTE glass. In some examples, the softening point of the low CTE glass can be above the melting point of silicon, so an alternate starting substrate having a higher melting temperature can be used along with corresponding alternate techniques for etching. Example substrate materials for the alternate substrate include SiC, tungsten (W), and Ti.

In an example, a bubble can be formed directly in the resonator layer by the following process. A substrate (e.g., composed of SiC, tungsten, and Ti) can be etched (e.g., using DRIE) to form an annular cavity and an anchor post. A resonator layer (e.g., $SiO_2$) can be bonded to the substrate. The resonator layer can be thinned to a desired thickness of the resonator. The substrate and the resonator layer can then be heated to the softening point of the resonator layer to form the bubble in the resonator layer. In some examples, the heating can be inductive heating and/or incremental laser heating such as a $CO_2$ laser beam directed through the open end of a furnace tube. A patterned sacrificial layer (e.g., $Si_3N_4$ and/or Molybdenum) on the substrate can be used to release the outer lip of the resonator. In some examples, the outer lip of the resonator can be heated with a laser or by blackbody radiation to produce a thicker wall at the outer lip.

Figure 5:
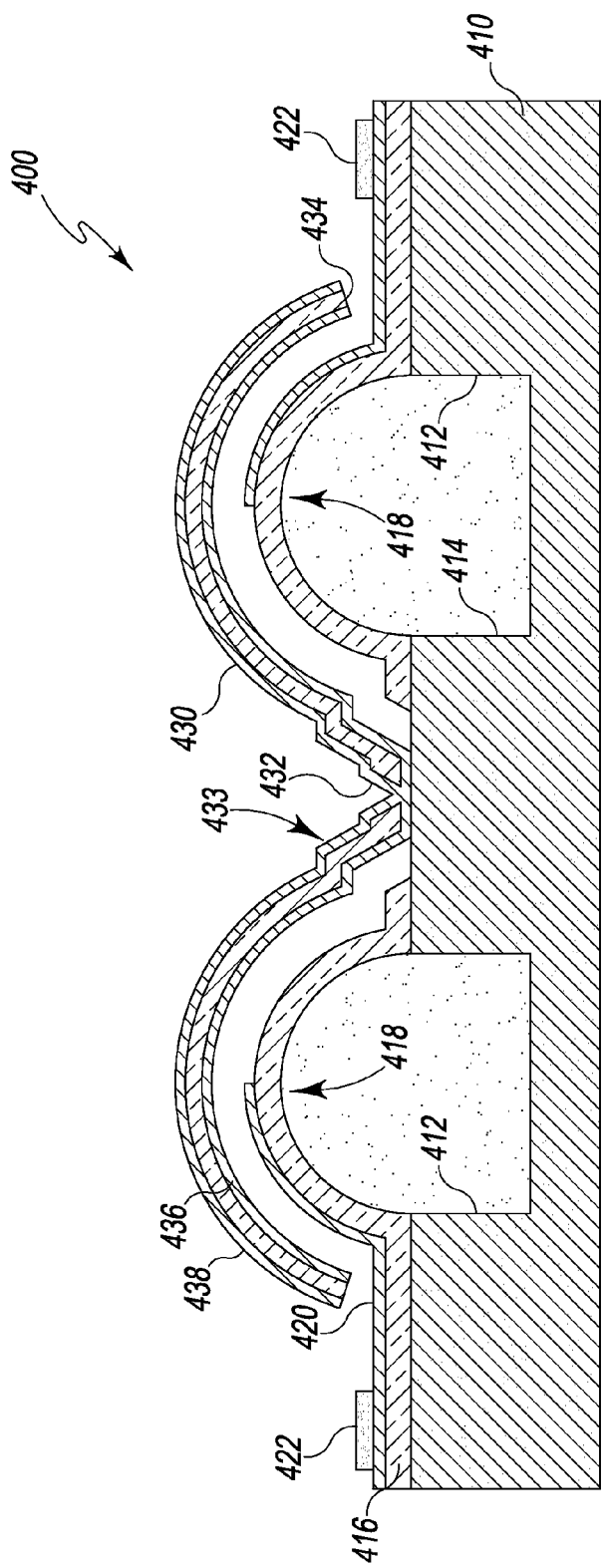
FIG. 5 is a cross-sectional side view of a hemitoroidal resonator gyroscope fabricated according to the process of FIGS. 4A-4M; and In accordance with common practice, the various described features are not drawn to scale but are drawn to emphasize specific features relevant to the exemplary embodiments.

FIG. 5 illustrates a cross-sectional side view of a hemitoroidal resonator gyroscope 400 fabricated according to the process of FIGS. 4A-4M. The gyroscope 400 can include a substrate 410, such as a silicon wafer, that defines an annular cavity 412. An anchor post 414 of the substrate 410 can extend through a central portion of the annular cavity 412. A bubble layer 416, composed of Pyrex glass for example, can be attached to an upper surface of the substrate 410. The bubble layer 416 can include a hemitoroidal bubble 418 over the annular cavity 412. A first conductive layer 420, composed of polysilicon for example, and comprising a plurality of electrodes can be disposed over the glass layer 416. A pad layer 422 can be disposed on a field portion of the conductive layer 420.

A hemitoroidal resonator 430 can be disposed over the hemitoroidal bubble 418 and annular cavity 412. In an example, the resonator 430 can be composed of a glass material with thin conductive layers 436 and 438 on the inner surface and the outer surface. The resonator 430 can include a stem 432 in a central portion thereof that is attached to the anchor post 414 of substrate 410. The stem 432 can include a step structure 433 formed as a result of the apertures in the bubble layer 416 and/or the sacrificial layer. The outer lip 434 of the resonator 430 can be positioned slightly apart from the conductive layer 420 such that the resonator 430 is allowed to vibrate freely about the stem 414.

The second conductive layer 436 comprising a plurality of electrodes on an inner surface (e.g., inner surface 112) of the resonator 430. The third conductive layer 438 on an outer surface (e.g., outer surface 118) can be continuous.

In an alternative embodiment, the electrodes can be replaced by comb fingers (e.g., protrusions on an outer lip of the resonator 430) formed on the outer lip 434 of the resonator 430. The comb fingers can be defined by patterning the photoresist (e.g., photoresist 340-1) on the flat field laterally adjacent to the outer lip 434 lip of the resonator 430. Then, the resonator layer can be etched to form the combs, and the combs can be coated with the third conductive layer 438.

While electrodes can be used for sensing the vibration of the resonator 430, in other examples, an optical sensor can be used to sense the vibration of the resonator 430. Thus, in an example, the drive and pickoff of the gyroscope 400 can be electrical and optical, respectively. In another example, the drive and pickoff can both be optical.

In another embodiment, the plurality of electrodes for driving the resonator 430 and sensing vibration (e.g., formed from the conductive layer 420) can be disposed outside of the hemitoroidal resonator 430. For example, the plurality of electrodes can be disposed on one or more additional bubbles formed on the substrate 410 laterally adjacent to the resonator 430.

In a further embodiment, the plurality of electrodes can be disposed on an electrode support structure (not shown) above the resonator 430. In this case, the second conductive layer 436 on an inner surface (e.g., inner surface 112) of the resonator 430 can be continuous and the third conductive layer 438 on an outer surface (e.g., outer surface 118) can comprise a plurality of electrodes. Additionally, one or more apertures can be formed in the electrode support structure in order to enable an etchant to quickly pass through for etching of a sacrificial layer between the resonator 430 and the electrode support structure. An electrical contact on the stem 434 of the resonator 430 can mechanically connect the resonator 430 to the electrode support structure. The electrode support structure can be composed of doped titania silicate glass to reduce thermal expansion mismatch.

In an example operation of the gyroscope 400, the hemitoroidal resonator 430 can be driven to resonance based on electrical signals provided to the first plurality of electrodes of the conductive layer 420. The electrical signals provided to these electrodes can induce movement in the second plurality of electrodes 436 on the inner surface of the resonator 430. In an example, this can cause n=2 quadrupole mode resonance in the resonator 430 as shown in FIG. 3A. When the gyroscope 400 is rotated the orientation of the n=2 quadrupole vibratory mode precesses about the symmetry axis of the hemitoroid, i.e., the central axis of the anchor post 414. The angle of precession is a measure of the integrated angle of the applied rotation. The precession can be sensed based on electrical property changes between the second plurality of electrodes 436 and the first plurality of electrodes of the conductive layer 420. Based on these sensed electrical property changes, information can be provided from the gyroscope via the pads 422 to other electrical components. The other electrical components can then determine a rotation of the gyroscope based on this information. In another example, the mode precession can be sensed optically, by measuring the time-varying obstruction of light beams caused by the vibratory motion of the n=2 quadrupole mode. In another example, the gyroscope 400 can operate in a force rebalance mode, in which rebalance voltages are applied to electrodes to produce forces on the resonator 430 that prevent the precession of the n=2 quadrupole mode when the gyroscope 400 is rotated. In this example, the rebalance voltages are a measure of the applied rotation rate.

According to examples described herein, a hemitoroidal resonator can be fabricated with sufficient precision for a high performance gyroscope. In some examples, the majority of the vibration for the hemitoroidal resonator can occur near the outer lip of the resonator. A measure of performance of a rate-integrating vibratory gyroscope is the angular gain factor, defined as the angle of rotation of the vibrating mode pattern measured with respect to the rotating resonator, divided by the angle of external applied rotation. In an example, the angular gain factor for the hemitoroidal resonator gyroscope can be about 0.58 compared to an angular gain factor of about 0.3 for a conventional hemispherical resonator gyroscope. Thus, the hemitoroidal resonator can reduce sources of error since the signal to noise ratio is about two (2) times higher than that of a conventional hemispherical resonator gyroscope.

Additionally, the stem of the resonator can be aligned with high precision. That is, a high degree of azimuthal symmetry (e.g., positioning of the stem with respect to the outer lip) can be achieved. In an example, the stem on the resonator can be positioned more precisely by a factor of around 20 times as compared to a conventional hemispherical resonator. This increased precision results in better symmetry for the resonator, which can improve performance. Additionally, the hemitoroidal resonator permits less costly, batch fabrication on a wafer.

Any of the example hemitoroidal gyroscopes discussed herein can be incorporated into an electronic device for obtaining rotational sensing information therefrom. For example, an electronic device can include a hemitoroidal gyroscope coupled to one or more processing devices which are coupled to one or more memory devices. The one or more memory devices can include instructions which, when executed by the one or more processing devices, can cause the one or more processing devices to perform one or more acts. In an example, the one or more processing devices can include a microprocessor, a microcontroller, a digital signal processor, field programmable gate array (FPGA), etc. The one or more memory devices can include any appropriate processor readable medium used for storage of processor readable instructions or data structures.

The processor-readable media can be implemented as any available media that can be accessed by a general purpose or special purpose computer or processor, or any programmable logic device. Suitable processor-readable media can include tangible media, such as storage or memory media, and transmission media such as electrical, electromagnetic, or digital signals, conveyed via a communication medium such as a network and/or a wireless link.

Storage or memory media can include magnetic or optical media, such as conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc.

In one example, the instructions can cause the one or more processing devices to receive information from the hemitoroidal gyroscope and use the information for inertial measurement purposes.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A vibratory structure gyroscope comprising:
a substrate having a top surface;
a resonator having a hemitoroidal shape, the resonator including a stem and an outer lip that surrounds the stem; and
a bubble layer disposed between the top surface of the substrate and the resonator;
wherein the stem is attached to the bubble layer, wherein the outer lip of the resonator is located apart from the bubble layer and the top surface of the substrate.

2. The vibratory structure gyroscope of claim 1, wherein the top surface of the substrate defines an annular cavity and an anchor post that extends through a central portion of the annular cavity, and wherein the stem of the resonator is attached to the bubble layer proximate the anchor post.

3. The vibratory structure gyroscope of claim 2, wherein the bubble layer includes a hemitoroidal bubble over the annular cavity.

4. The vibratory structure gyroscope of claim 3, wherein the bubble layer comprises a glass material.

5. The vibratory structure gyroscope of claim 2, further comprising a conductive layer deposited on the bubble layer.

* * * * *